United States Patent [19]

Ozaki et al.

[11] Patent Number: 4,996,168

[45] Date of Patent: Feb. 26, 1991

[54] METHOD FOR MANUFACTURING P TYPE SEMICONDUCTOR DEVICE EMPLOYING DIFFUSION OF BORON GLASS

[75] Inventors: Hiroji Ozaki; Shigeo Nagao, both of Hyogo, Japan

[73] Assignee: Mitsubishi Denki Kabushiki Kaisha, Tokyo, Japan

[21] Appl. No.: 265,448

[22] Filed: Nov. 1, 1988

[30] Foreign Application Priority Data

Nov. 7, 1987 [JP] Japan .................... 62-281729

[51] Int. Cl.$^5$ ............... H01L 21/223; H01L 21/225; H01L 21/383; H01L 21/385

[52] U.S. Cl. .................................. 437/164; 437/41; 437/44; 437/141; 437/149; 437/150; 437/152; 437/153; 437/154; 437/160; 437/168; 437/162

[58] Field of Search .............. 357/46, 47, 41, 42, 357/52; 437/40, 41, 56, 57, 34, 44, 162, 164, 160, 168, 152, 147, 141, 149, 153, 154, 157, 150

[56] References Cited

U.S. PATENT DOCUMENTS

| | | | |
|---|---|---|---|
| 3,914,138 | 10/1975 | Rai-Choudhury | 437/143 |
| 3,928,096 | 12/1975 | Vergano et al. | 437/168 |
| 3,940,747 | 2/1976 | Kuo et al. | 365/186 |
| 3,998,668 | 12/1976 | Florence et al. | 437/169 |
| 3,999,213 | 12/1976 | Brandt et al. | 437/57 |
| 4,006,046 | 2/1977 | Pravin | 437/148 |
| 4,016,594 | 4/1977 | Shappir | 357/42 |
| 4,115,796 | 9/1978 | Fujimoto et al. | 357/42 |
| 4,175,317 | 11/1979 | Aoki et al. | 437/164 |
| 4,188,707 | 2/1980 | Asano et al. | 437/162 |
| 4,203,126 | 5/1980 | Yim et al. | 357/41 |
| 4,204,894 | 5/1980 | Komeda et al. | 437/44 |
| 4,232,328 | 11/1980 | Hartman et al. | 357/44 |
| 4,242,693 | 12/1980 | Biran | 357/34 |
| 4,273,805 | 6/1981 | Dawson et al. | 437/203 |
| 4,305,086 | 12/1981 | Khajezadeh | 437/41 |
| 4,313,782 | 2/1982 | Sokoloski | 437/46 |
| 4,404,733 | 9/1983 | Sasaki | 437/41 |
| 4,466,175 | 8/1984 | Coe | 437/51 |
| 4,498,094 | 2/1985 | Houthoff et al. | 357/86 |
| 4,558,507 | 12/1985 | Okabayashi et al. | 437/24 |
| 4,595,941 | 6/1986 | Avery | 357/43 |
| 4,603,472 | 8/1986 | Schwabe et al. | 357/42 |
| 4,654,121 | 3/1987 | Miller et al. | 437/57 |
| 4,755,479 | 7/1988 | Miura | 437/44 |

FOREIGN PATENT DOCUMENTS

| | | |
|---|---|---|
| 0137645 | 8/1984 | European Pat. Off. |
| 92611 | 5/1985 | Japan |
| 61-114523 | 6/1986 | Japan |
| 121326 | 6/1986 | Japan |
| 62-62516 | 3/1987 | Japan |
| 8702825 | 5/1987 | World Int. Prop. O. |

OTHER PUBLICATIONS

S. K. Ghandhi, VLSI Fabrication Principles, J. Wiley & Sons, 1983, pp. 440 to 441.
W. Maly, "Atlas of IC Technologies: An Introduction to VLSI Processes", The Benjamin/Cummings Publishing Co. Inc., Advanced NMOS Technology.
Broadbent et al., "Self-Aligned Silicided (PtSi and CoSi$_2$) Ultra-Shallow p+/n Junctions", IEEE Electron Device Letters, vol. EDL-8, No. 7, Jul. 1987.
N. Goldsmith et al., "Boron Nitride as a Diffusion Source for Silicon", RCA Reviewing, No. 2 (Jun. 1967).
A. C. Adams and C. D. Capio, "The Chemical Deposition of Boron-Nitrogen Films", J. Electrochem. Soc.: Solid-State Science and Technology, vol. 127, No. 2 (Feb. 1980).
A. Adams et al., "The High Temperature Deposition and Evaluation of Phosphorus- or Boron-Doped Silicon Dioxide Films", J. Electrochem. Soc.: Solid-State Science and Technology, vol. 1, 126, No. 2 (Feb. 1979).

Primary Examiner—Brian E. Hearn
Assistant Examiner—M. Wilczewski
Attorney, Agent, or Firm—Lowe, Price, LeBlanc, Becker & Shur

[57] ABSTRACT

An improved method for manufacturing P type semiconductor device such as used for memories is disclosed. Channeling such as caused by an ion implantation process is prevented by adopting a diffusion method to diffuse boron (7) from a boron glass formed on a layer of polysilicon or silicon oxide on a semiconductor substrate. This method provides a semiconductor device with shallow P type impurity diffusion regions.

11 Claims, 9 Drawing Sheets

METHOD FOR MANUFACTURING P TYPE SEMICONDUCTOR DEVICE EMPLOYING DIFFUSION OF BORON GLASS

BACKGROUND OF THE INVENTION

1. Field of the Invention

The present invention relates to a method for manufacturing a semiconductor device and, more particularly, to a method for manufacturing a P channel field effect transistor.

2. Description of the Prior Art

The present invention is applicable to a MOS type semiconductor memory comprising a MOS transistor, and particularly to a MOS dynamic RAM (Random Access Memory).

A description is made hereinafter as to the MOS dynamic RAM which is the background of the present invention.

FIG. 1A is a block diagram showing an example of a simplified circuit of a conventional 1M bit dynamic RAM (Random Access Memory) having 1048576 memory cells. Referring to FIG. 1A, an outline of the basic operation of the dynamic RAM will be hereinafter described.

A clock generator 10 receives an RAS (Row Address Strobe) signal, CAS (Column Address Strobe) signal from a CPU (Central Processing Unit) and generates clock signals $\phi_1$ and $\phi_2$. In the normal read/write operation of the dynamic RAM, an address buffer 21 receives external address inputs $A_0$ to $A_9$ on a time sharing basis and applies internal address signals $A_0$ to $A_9$ on a time share basis to a row decoder 22 and a column decoder 23. The row decoder 22 and the column decoder 23 decode the internal address signals $A_0$ to $A_9$ and apply the decoded signals to a memory cell array 25 and an I/O control 24. The writing operation of the input data and the reading operation of the output data are carried out for a memory cell having the address designated as described above. The data in buffer 26 receives the input data and transfers the input data to the memory cell array 25 via the I/O control 24 and the sense amplifiers in response to a clock signal. On the other hand, the data out buffer 27 receives the data from the memory cell array 25 via the sense amplifiers and the I/O control 24 and outputs the output data in response to the clock signal.

FIG. 1B is a block diagram showing a major portion of a conventional dynamic RAM.

Referring to FIG. 1B, the major portion of dynamic RAM comprises an array comprising a plurality of memory cells serving as memory portions, row decoder and a column decoder for selecting an address of each memory cell, and a peripheral circuit portion comprising a sense amplifier connected to data in/out buffers. The plurality of memory cells serving as memory portions are each connected to intersection points of word lines connected to the row decoder and bit lines connected to the column decoder, these word and bit lines constituting a matrix. The above-mentioned array is thus implemented.

Next, an operation of the dynamic RAM is described. When a word line and a bit line are selected by the row decoder and the column decoder in response to a row address signal and a column address signal externally provided, a memory cell at the intersection point of the word line and the bit line is selected, and information is read from or written in the memory cell through the sense amplifier. As to the detail explanation of dynamic RAM, U.S. Pat. No. 3,940,747, entitled "High Density, High Speed Random Access Read-Write Memory" can be referred to.

In this invention, other portion than memory cell 25 in FIG. 1A is to be defined as a peripheral circuit hereinafter.

FIG. 2 is a view showing a cross section of a memory cell in the memory cell portion 25 and an equivalent circuit thereof.

The memory cell portion of the dynamic RAM comprises a transistor and a capacitance. As shown in FIG. 2, the transistor comprises a MOS transistor 31 of an N channel type and the capacitance comprises a cell plate 32 and an N+ layer 33.

FIG. 3 is a view showing a cross section of a peripheral circuit such as row and column address buffer 21, clock generator circuit 10 and so on, and an equivalent circuit thereof. The peripheral circuit portion generally comprises a CMOS inverter.

The CMOS inverter comprises an N channel transistor TN formed in a p substrate 21 and a P channel transistor TP formed in an n well 1.

FIGS. 4 and 5 are sectional views of a conventional PMOSFET used for a peripheral circuit portion of a dynamic type semiconductor memory device. A gate electrode 3 is formed on a main surface of an N type semiconductor device or an N type well 1 through an insulating film 5 and P+ diffusion layer 4 serving as a source and a drain is formed beneath both end portions of the gate electrode 3 and on the main surface of the substrate 1. The P+ diffusion layer is formed by ion implantation of B or $BF_2$. A wiring layer 6 is connected to the source and the drain. Ion implantation is made of B or $BF_2$ in an connection portion 7 to lower a contact resistance.

The formed elements are isolated by an element isolating layer 2.

Next, a description is made of operation. A predetermined voltage is applied to the gate electrode 3. As a result, a P type channel is formed beneath the gate electrode 3, which connects the source 4 to the drain 4. Then, selection is made of a desired memory cell to and from which data is written and read.

Conventionally, the source and drain of the PMOSFET have been formed by ion implantation of B and $BF_2$. A light ion such as B or $BF_2$ causes a channeling phenomenon on the occasion of ion implantation. The term of "channeling" means that a tunnel is formed in a constant direction of a crystalline axis of a substrate. The channeling causes a problem in which a projection distance of the implanted ion cannot be constant. As a result, a shallow P+ layer is not formed. In order to form a shallow P+ layer, silicon must be implanted in advance on the substrate to prevent the channeling. On the other hand, B+ has a large diffusion coefficient as compared with $As^+$. Therefore, it is necessary that annealing is performed at a lower temperature. However, in case where silicon has been implanted on the substrate, annealing needs to be preformed at a higher temperature, because damage due to the silicon implantation was caused on the substrate.

Consequently, the P+ layer forms only a deep layer as compared with N+ layer. Therefore, it is difficult to form the PMOSFET having a small channel dimension.

On the other hand, when a contact portion connecting the source and drain portion to the wiring is formed, B and BF$_2$ are implanted after a contact hole is formed in order to lower a contact resistance. FIG. 5 shows the contact portion of the source and drain of the conventional PMOSFET.

As described above, B and BF$_2$ generate the channeling on the occasion of implantation and also have a long diffusion length. When B and BF$_2$ are implanted to the contact portion, the P+ layer is diffused beneath the gate electrode which is adjacent to the contact portion. As a result, the channel length of the PMOSFET becomes short, so that it is difficult to make the PMOSFET small.

SUMMARY OF THE INVENTION

It is an object of the present invention to provide a method for manufacturing a P type semiconductor device which can be highly integrated.

It is another object of the present invention to provide a method for manufacturing a P type MOSFET which can be made small.

It is a further object of the present invention to provide a method for manufacturing a P type MOSFET using diffusion of a boron glass.

It is still another object of the present invention to provide a method for manufacturing a P type MOSFET having a small channel dimension.

It is still a further object of the present invention to provide a method for manufacturing a LDD type P channel field effect transistor which can be highly integrated.

The aforementioned objects of the present invention are attained when a manufacturing method for the P type semiconductor device comprises the following steps, that is, the steps of preparing a semiconductor substrate having a main surface and a region having an N type predetermined impurity concentration, forming a conductor layer having opposite end portions of a predetermined width, on the N type main surface through an insulating film, forming a diffusion preventing layer on the upper portion and opposite end portions of the conductor layer, on the portion spaced at predetermined intervals apart from the opposite end portions of the conductor layer and on the main surface, forming a boron glass by depositing boron nitride on the region where the diffusion preventing layer is not formed and on the main surface, and diffusing the boron glass.

When the P type semiconductor device is manufactured not using the ion implantation method but using the aforementioned method, channeling is not caused and a shallow P type semiconductor region can be formed. As a result, there is provided a method for manufacturing a small P type semiconductor device which can be highly integrated.

According to a preferred embodiment, the conductor layer and the P+ diffusion layer form a field effect device and the field effect device comprises a P channel field effect transistor in which the semiconductor layer is a gate electrode, the P+ diffusion layer is either a drain or source and a portion sandwiched by the P+ diffusion layers is a P channel region.

The semiconductor device comprises the field effect transistor described above. Thus, the present method provides for the manufacturing of a small P type MOSFET.

According to a preferred embodiment, the method for manufacturing the P type semiconductor device comprises the steps of removing the diffusion preventing layer after the step of forming the boron glass by depositing boron nitride and diffusing the boron glass, forming a second diffusion preventing layer at the position the diffusion preventing layer was formed, forming a boron glass by depositing boron nitride again on the semiconductor substrate where the second diffusion preventing layer is formed, and diffusing the boron glass, whereby the LDD type P channel field effect transistor is formed.

Since the method for manufacturing the P type semiconductor device comprises the aforementioned steps, an LDD type P channel FET can be formed without using ion implantation. As a result, there is provided a method for manufacturing a highly integrated LDD type P channel FET.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Referring to the figures, a description is made of one embodiment of the present invention. FIGS. 6A to 6D are views showing forming processes of the source and drain regions of the PMOSFET formed in accordance with an embodiment of the present invention.

Figure 1A:
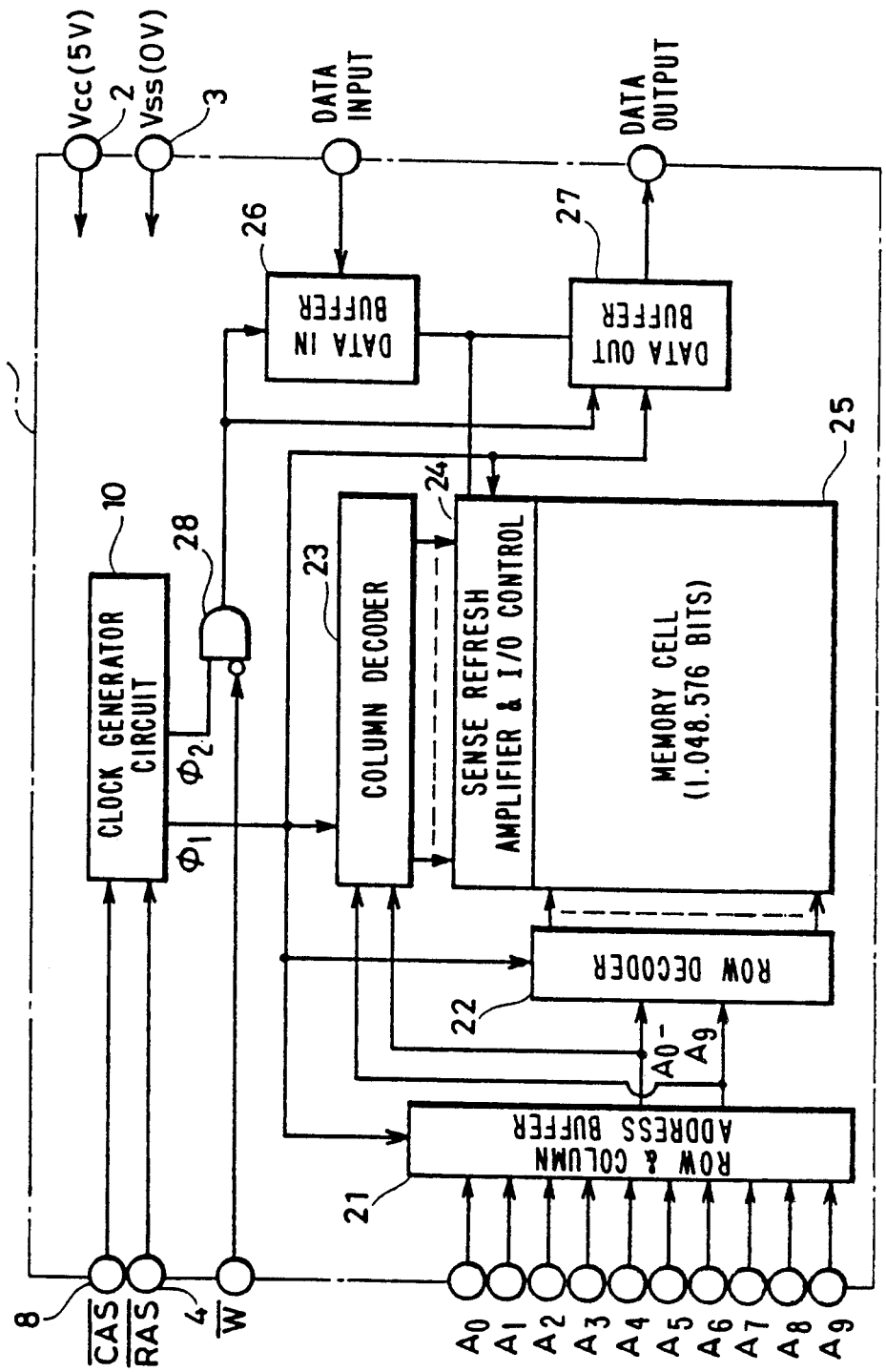
FIG. 1A is a block diagram showing an example of a simplified circuit of a conventional dynamic RAM.
Figure 1B:
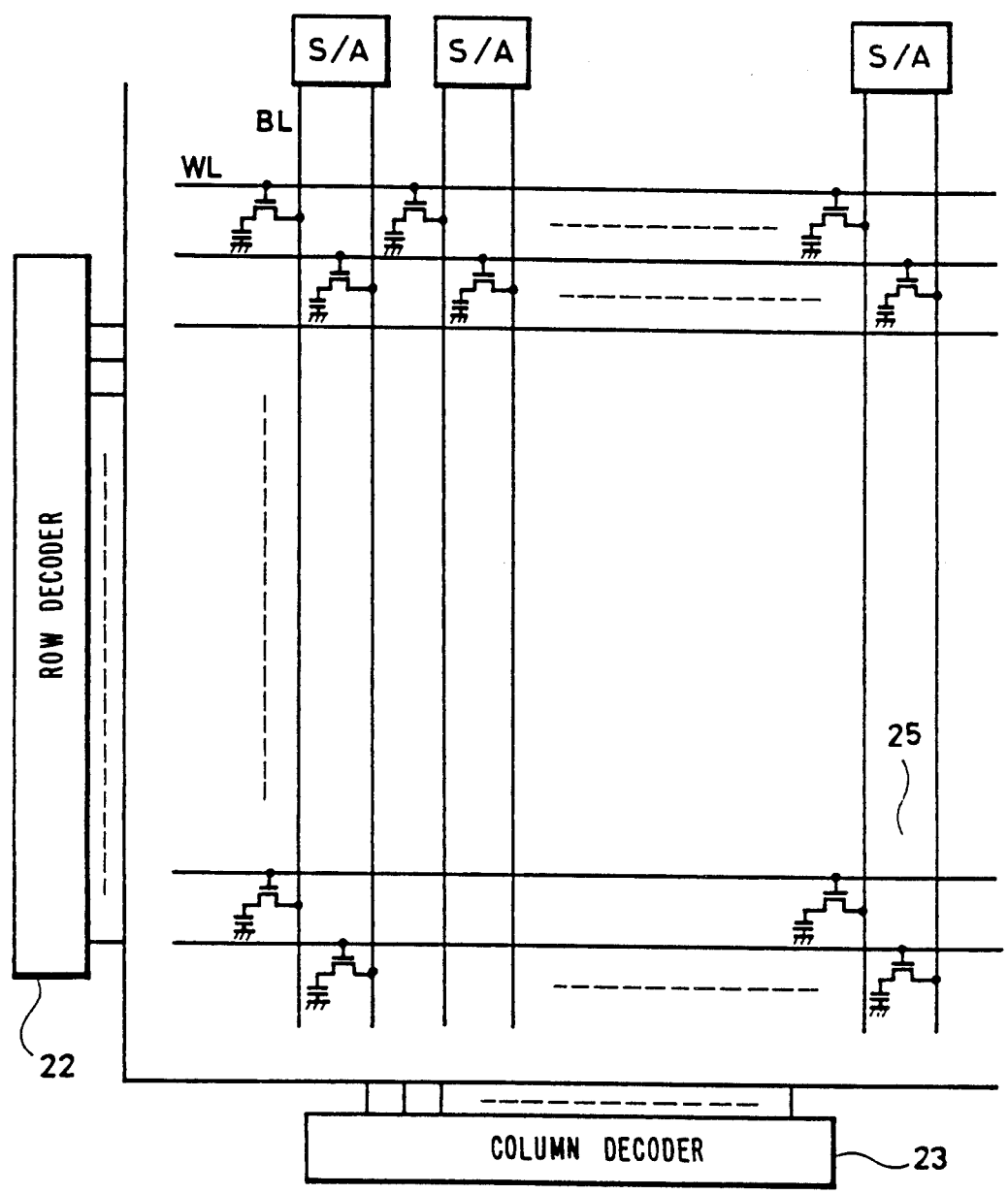
FIG. 1B is a block diagram showing a major portion of a conventional dynamic RAM.
Figure 2:
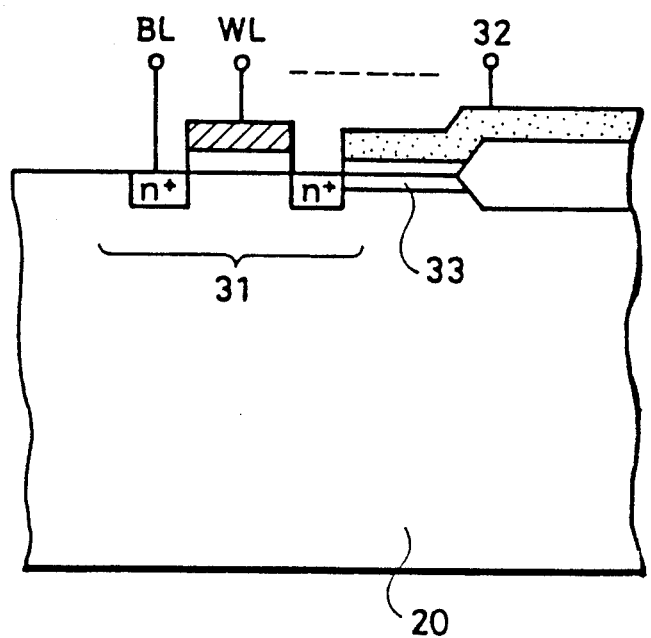
FIG. 2 shows a cross section of a memory cell in a memory cell portion and an equivalent circuit thereof.
Figure 2:
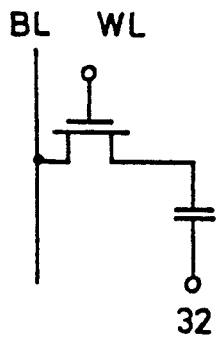
Figure 3:
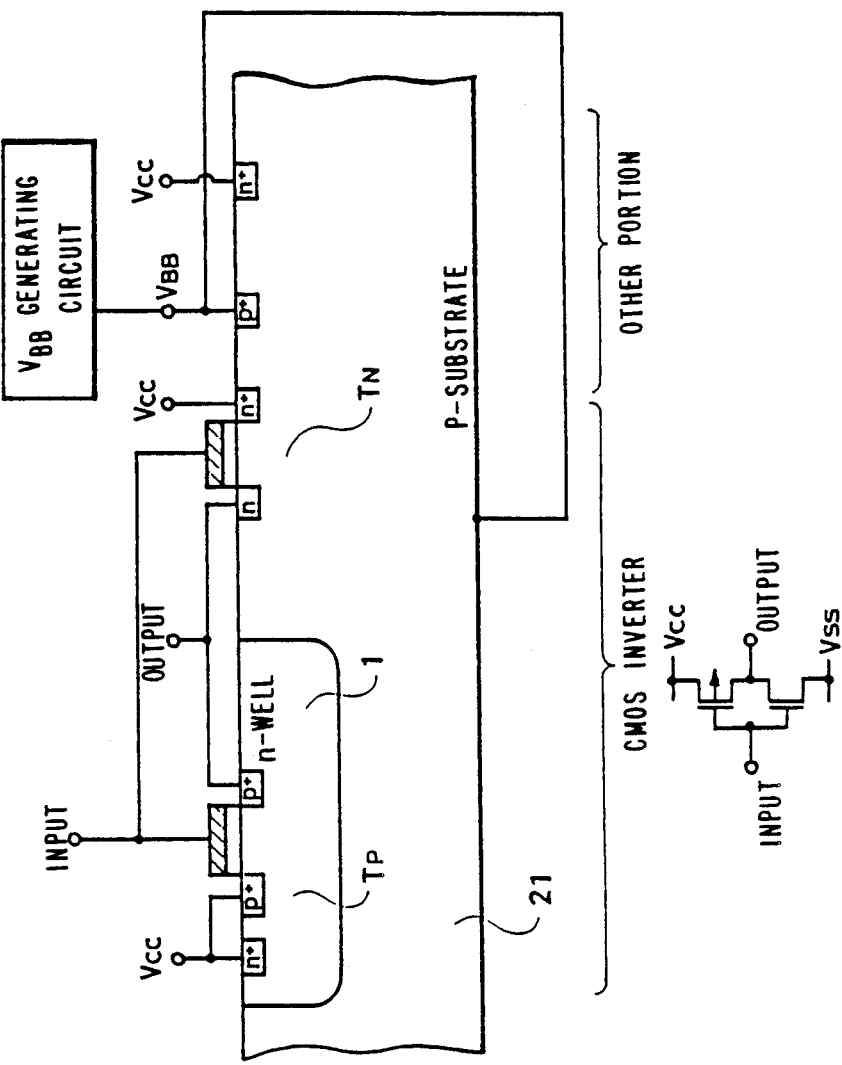
FIG. 3 shows a cross section of a peripheral circuit and an equivalent circuit thereof.
Figure 4:
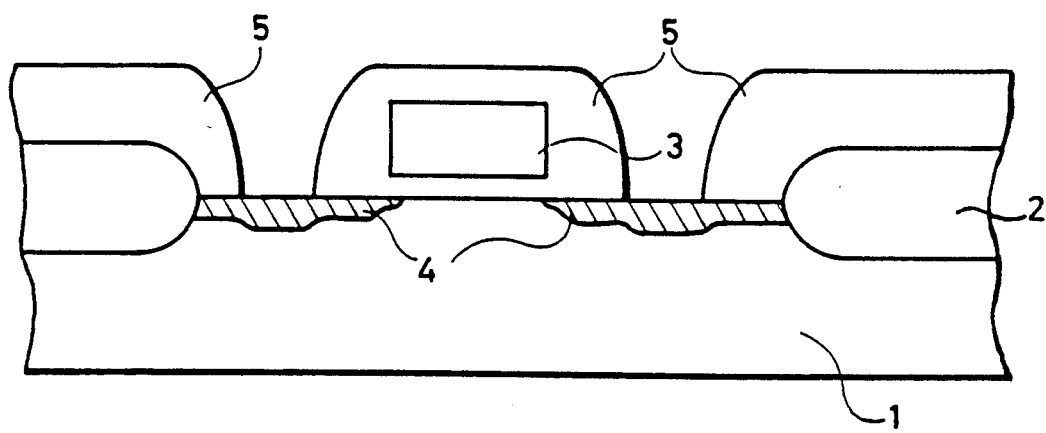
FIGS. 4 and 5 are cross sectional views showing a conventional P type MOSFET used in the peripheral circuit portion of a dynamic RAM.
Figure 5:
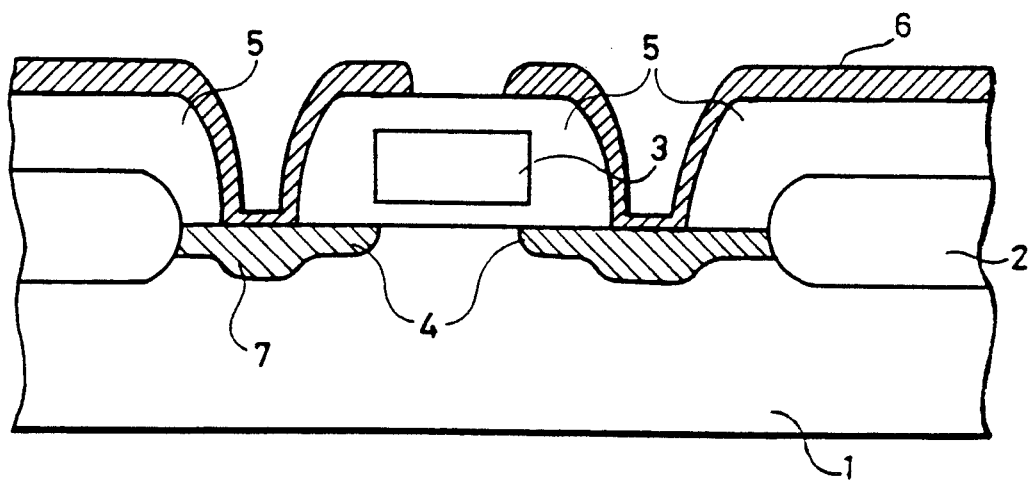
Figure 6A:
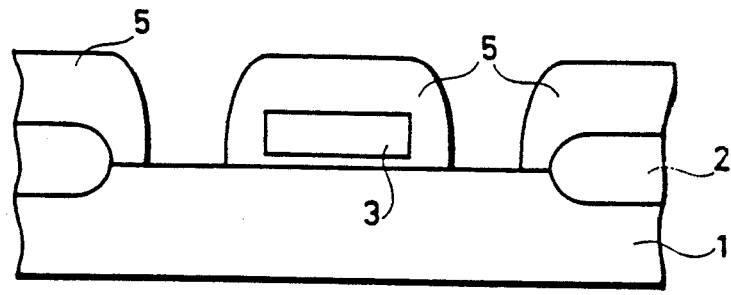
FIGS. 6A to 6D are views showing forming processes of source and drain regions of the PMOSFET formed by the process in accordance with the present invention in a stepwise manner.
Figure 6B:
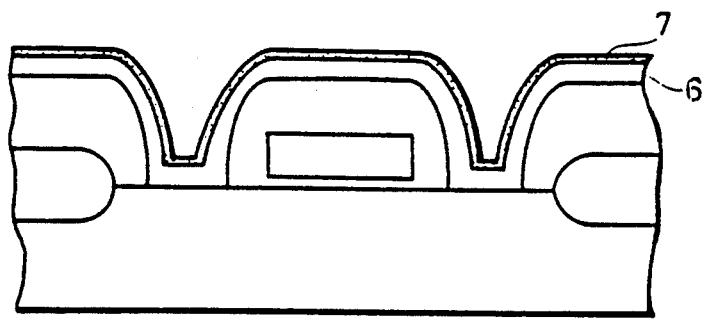
Figure 6C:
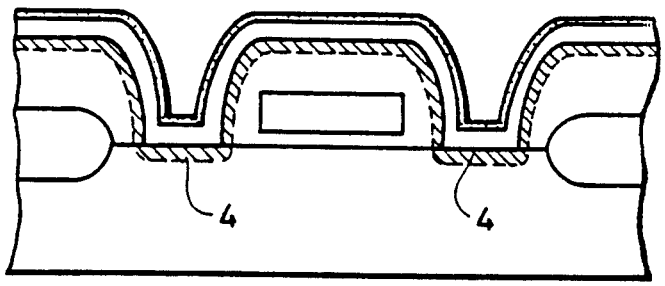

Referring to FIG. 6A, a device isolation oxide film 2, a gate electrode 3 and insulating film 5 are formed on a substrate 1. The insulating film at predetermined positions is removed to form source and drain regions.

Figure 6D:
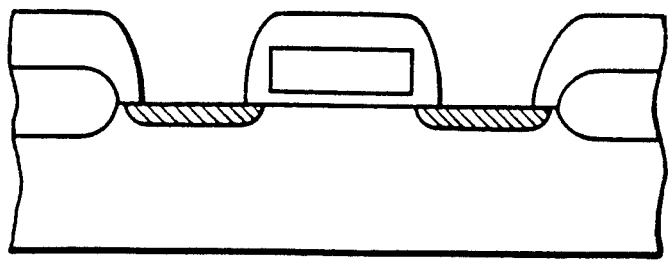

A thin polysilicon or thin oxide film 6 is formed from the upper portion of the substrate 1 and boron nitride is diffused to form a boron glass, thereon so that a boron glass 7 is formed (FIG. 6B) by a method for diffusing the boron glass (which is hereinafter referred to as a BN deposition and diffusion method). As described above, the reason why the boron nitride is deposited through the thin polysilicon or the thin oxide film 6 is that damage is caused on the surface of the substrate 1 when the boron glass is deposited directly on the substrate 1 using the BN deposition and diffusion method. Then, a P+ diffusion layer 4 is formed on the source and drain portions by annealing the substrate 1 at a low temperature. Thereafter, the boron glass 7 and the thin polysilicon 6 are removed by etching (FIG. 6D).

Next, a description is made of formation of the contact portion. FIGS. 7A to 7D are views showing forming processes of the contact region of the PMOSFET formed in accordance with one embodiment of the present invention.

The processes in FIGS. 7A to 7D are the same as those in FIGS. 6A to 6D except that the source and drain regions 4 are formed on the substrate 1.

Figure 7A:
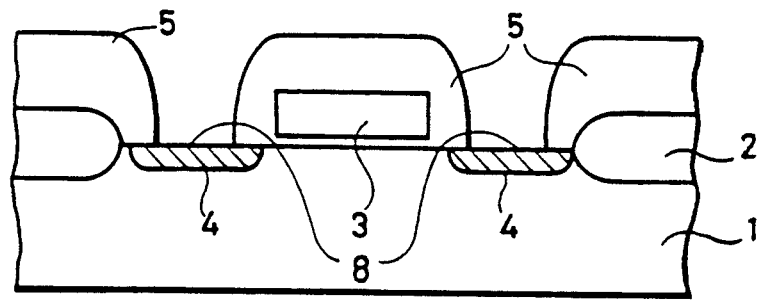
FIGS. 7A to 7D are views showing forming processes of contact region of the PMOSFET formed by the process in accordance with the present invention in a stepwise manner.
Figure 7B:
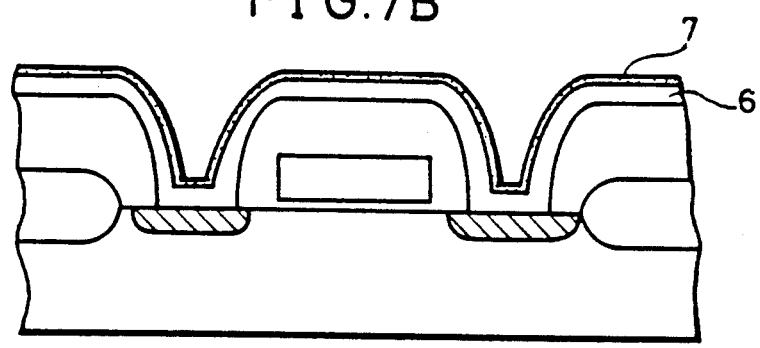
Figure 7C:
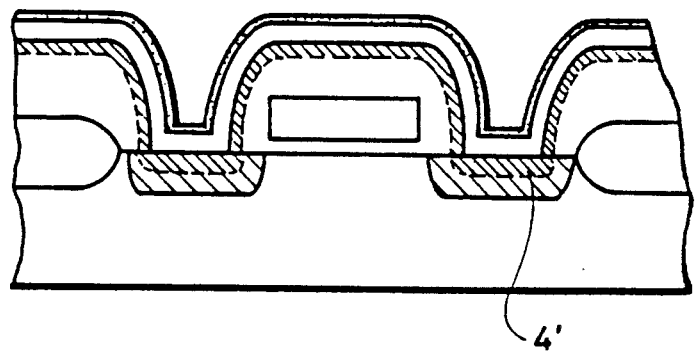
Figure 7D:
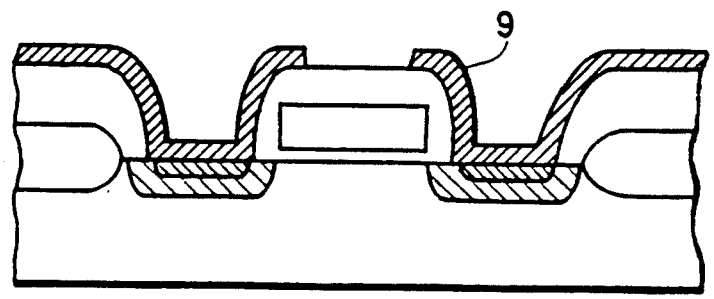

At first, the semiconductor substrate 1 is prepared on which the P+ diffusion layer 4 serving as the source and drain, the gate electrode 3, the device insulation film 2, an interlayer insulating film 5, and a contact portion are formed (FIG. 7A). Then, the thin polysilicon or the thin oxide film 6 is formed from the upper portion of the substrate 1 and the boron glass 7 is deposited thereon by the BN deposition and diffusion method (FIG. 7B). By annealing the substrate 1 at a low temperature, a P+ diffusion layer 4' is formed on the contact portion (FIG. 7C). After etching, the boron glass 7 and the thin polysilicon and the like are removed and then the wiring layer 9 is formed on the contact portion 8 (FIG. 7D).

Then a description is made of the BN deposition and diffusion method. The BN deposition and diffusion method are described in detail in "Boron Nitride as a Diffusion Source for Silicon" N. Goldsmith et al., RCA Review No. 2 Jun. 1967.

Figure 8:
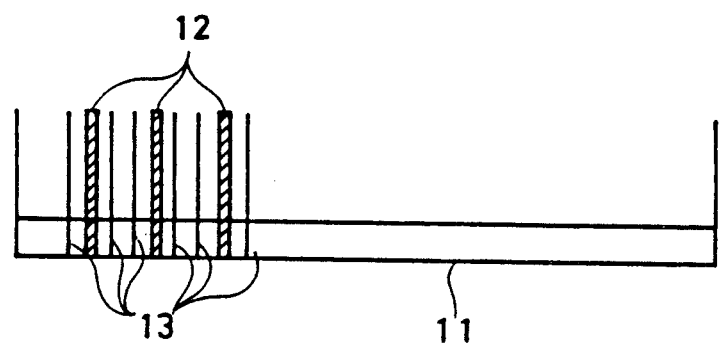
FIG. 8 is a view showing a concrete procedure of the present invention.

A concrete procedure is shown in FIG. 8. Referring to FIG. 8, a plurality of boron nitride (which is hereinafter referred to as BN) solid sources 12 are arranged on a wafer boat 11. A plurality of wafers 13 are arranged with its main surface directed to the BN solid sources 12. Then, the wafer boat is put in a furnace with the BN solid sources 12 and the wafers 13 thereon. Then, the boron glass is deposited and annealed. By the aforementioned processes, the thin P+ diffusion layer with high concentration is formed on the semiconductor substrate.

According to the above mentioned embodiment, the source and drain of the PMOSFET are formed by a one time deposition and diffusion of BN. The PMOSFET of the LDD (Lightly Doped Drain) structure may be formed by a two-time deposition and diffusion of BN;. In this case, the BN diffusion concentration is smaller the first time than the second time by one to two figures. In addition, this concentration is the same when an ion implantation method is employed.

Figure 9A:
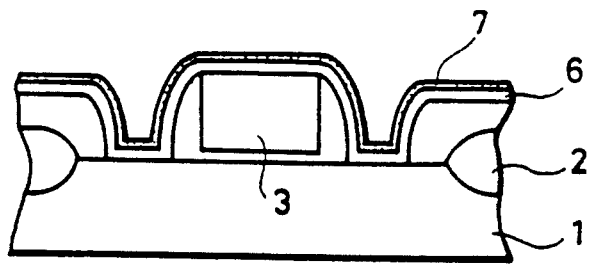
FIGS. 9A to 9H are views showing forming processes of a LDD type PMOSFET in accordance with the present invention in a stepwise manner.
Figure 9B:
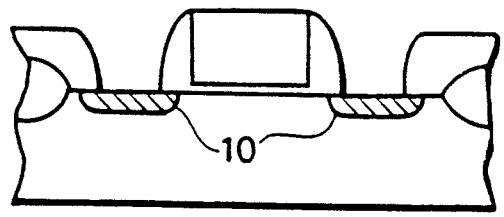
Figure 9C:
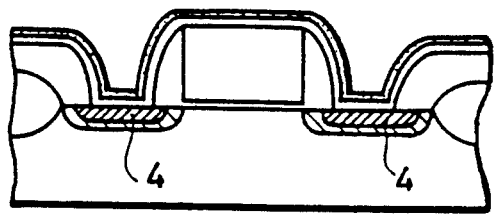
Figure 9D:
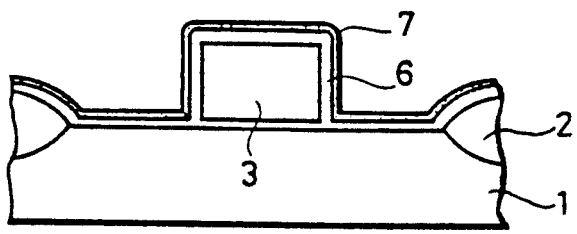
Figure 9E:
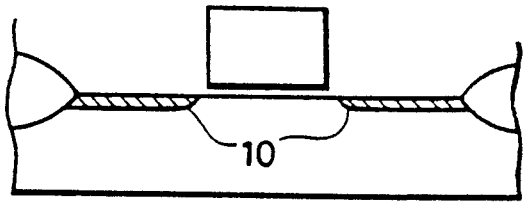
Figure 9F:
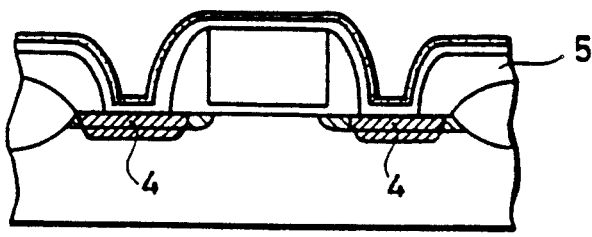
Figure 9G:
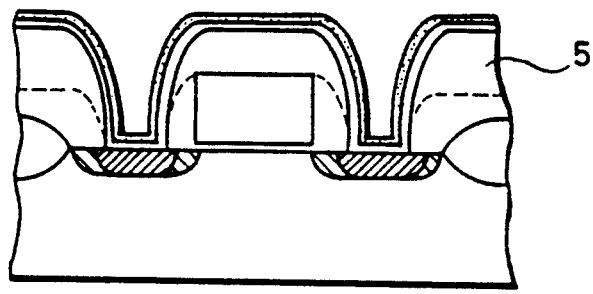
Figure 9H:
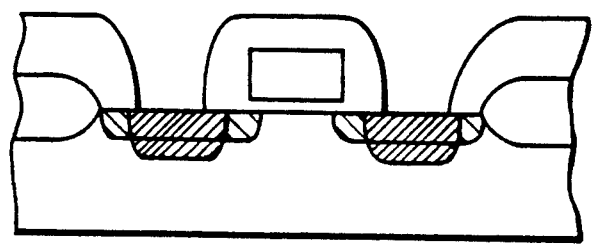

FIGS. 9A to 9H show a method for manufacturing the PMOSFET of the LDD structure. There are three kinds of manufacturing methods for the PMOSFET of the LDD structure. One of them is shown in FIGS. 9A to 9C and FIG. 9H. FIG. 9A is the same as FIG. 6B. The step described so far are the same as those shown in FIGS. 6A and 6B. Then, the thin silicon oxide film or the polysilicon 6 and the boron glass 7 are removed and by annealing the substrate 1, a lightly doped P+ region 10 is formed on a predetermined position (FIG. 9B). Then, the boron glass 7 is formed on a predetermined position through the thin silicon oxide film or the polysilicon 6 again by the BN deposition and diffusion method. The substrate 1 is annealed with the boron glass 7 attached thereon. The PMOSFET of the LDD structure is formed on the source and drain regions in this way (FIG. 9C). Thereafter, the silicon oxide film or the polysilicon 6 and the boron glass are removed (FIG. 9H).

A description is made of another method by which an LDD structure is formed. According to this method, the P+ diffusion region with high concentration is formed together with the contact layer. Manufacturing processes in accordance with this method are shown in FIGS. 9A, 9B and 9G. After the lightly doped P+ region is formed (FIG. 9B), the insulating film 5 is formed on the gate electrode 3 and the boron glass 7 is formed thereon through the thin silicon oxide film or the polysilicon 6 by the BN deposition and diffusion method. Thereafter, the substrate 1 is annealed and the thick P+ diffusion region 4 and the contact layer are simultaneously formed (FIGS. 9G and 9H). By employing this method, the BN deposition and diffusion method can be used in a barrier metal process.

Still another method for forming an LDD structure is shown in FIGS. 9D to 9F. According to the method, at first the gate electrode 3 is formed on a predetermined position. The boron glass 7 is formed on the gate electrode 3 through the thin silicon oxide film or the polysilicon 6 by the BN deposition and diffusion method (FIG. 9D). After the thin silicon oxide film or polysilicon 6 and the boron glass 7 are removed, the substrate 1 is annealed at a low temperature. As a result, the lightly doped P+ region 10 is formed at a predetermined position (FIG. 9E). Then, a side wall is formed on the gate electrode 3 and the insulating film is formed at a predetermined position. The thin silicon oxide film or the polysilicon is formed on the gate electrode 3, the sidewall and the insulating film 5 and the boron glass 7 is formed thereon by the BN deposition and diffusion method. The substrate 1 is annealed with the boron glass 7 attached thereon and the thick P+ diffusion layer 4 is formed at a predetermined position (FIG. 9F). Thereafter, the silicon oxide film or the polysilicon 6 and the boron glass are removed (FIG. 9H).

If the aforementioned processes are applied when a CMOS device is manufactured, an N channel transistor region must be covered with a thick oxide film and the like.

Although a description was made as to the case where the N type semiconductor substrate is used in the embodiment, the same effect can be obtained if an n well is used. The wiring layer 9 may be a material for barrier metal (for example, titanium and the like). The wiring layer may be formed and patterned thereon.

According to the present invention, the P type semiconductor region of the PMOSFET is formed by depositing the boron glass and diffusing boron from the boron glass. Since a conventional ion implantation is not used, channeling is not generated and a shallow P type impurity layer can be formed. Since a silicon implantation which was conventionally necessary for preventing the channeling is not necessary, it is possible to use a lower annealing temperature. Accordingly, the diffusion region of the P type impurity can be reduced. As a result, there can be provided the method for manufacturing the P type semiconductor device which can be made small and highly integrated.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a P-type semiconductor device, comprising
    preparing a semiconductor substrate having a main surface and a region having a predetermined N-type impurity concentration;
    forming a conductor layer having an upper portion and opposite end portions on the main surface of the semiconductor substrate, and an insulating film on portions spaced at predetermined intervals apart from the opposite portions of a predetermined width of the main surface of the semiconductor substrate;
    forming a diffusion preventing layer on the upper and opposite end portions of the conductor layer and on the spaced apart portions of the insulating layer, and on portions spaced at predetermined intervals apart from the opposite end portions of the conductor layer of the main surface contiguous to the conductor layer and the insulating layer;
    forming a first layer comprising polysilicon or silicon oxide on the diffusion preventing layer and on the region of the main surface of said semiconductor substrate where the diffusion preventing layer is not formed for a boron glass to be formed on the main surface of the semiconductor substrate;
    forming a first boron glass by depositing first boron nitride on the first layer of polysilicon or silicon oxide; and
    forming a first P-type diffusion layer by diffusing the first boron glass to thereby form a shallow P-type diffusion layer in the substrate on the region where the diffusion preventing layer does not exist.

2. The method for manufacturing a P-type semiconductor device of claim 1, wherein
    the first layer for the boron glass to be formed on comprises a thin polysilicon.

3. The method for manufacturing a P-type semiconductor device of claim 1, wherein
    the first layer for the boron glass to be formed on comprises a thin oxide.

4. The method for manufacturing a P-type semiconductor device of claim 1, further comprising
    removing the first layer for the boron glass to be formed on the boron glass after forming the P-type diffusion layer.

5. The method for manufacturing semiconductor device of claim 4, wherein
    the conductor layer and the P-type diffusion layer form a field effect device.

6. The method for manufacturing a semiconductor device of claim 5, wherein
    the field effect device comprises a P channel field effect transistor in which the conductor layer is a gate electrode;
    the P-type diffusion layer is either a drain or source region; and
    the portion sandwiched by the diffusion layer is a P channel region.

7. The method for manufacturing a semiconductor device of claim 6, further comprising after removing the first layer and the first boron glass
    forming a second layer for the boron glass to be formed on a region of the main surface of the semiconductor substrate smaller than the region where the diffusion preventing layer is not formed;
    forming a second boron glass on the second layer for the boron glass to be formed; and
    forming a second P-type diffusion layer in the substrate on a region smaller than the first P-type diffusion layer by diffusing said second boron glass to thereby form an LDD type P channel field effect transistor.

8. The method for manufacturing a semiconductor device of claim 7, wherein
    the first P-type diffusion layer has a first P-type impurity concentration;
    the second P-type diffusion layer has a second P-type impurity concentration; and
    the first P-type impurity concentration is selected so as to be lower than the second P-type impurity concentration.

9. The method for manufacturing a semiconductor device of claim 6, wherein
    the main surface of the semiconductor substrate and one portion of the region where the diffusion preventing layer is not formed comprise a contact region connecting the P-type diffusion layer to a wiring layer; the method further comprising
    forming a second diffusion preventing layer on the region other than the contact region of the P channel field effect transistor where the P-type diffusion layer is formed;
    forming a third layer for the boron glass to be formed on the main surface of the semiconductor substrate in the region where the second diffusion preventing layer is not formed;
    forming a third boron glass on the third layer for the boron glass to be formed on; and
    forming a third P-type diffusion layer on the inside of the first P-type diffusion layer by diffusing the third boron glass, thereby reducing the contact resistance of the contact region.

10. The method for manufacturing a semiconductor device of claim 6, wherein
    the P channel field effect transistor comprises a P channel field effect transistor used as a complementary field effect transistor.

11. The method for manufacturing a semiconductor device of claim 10, wherein
    the complementary field effect transistor comprises a complementary field effect transistor used in a peripheral circuit portion of a dynamic type semiconductor memory device.

* * * * *